United States Patent
Sin et al.

(10) Patent No.: US 9,438,227 B2
(45) Date of Patent: Sep. 6, 2016

(54) GATE-CONTROLLED P-I-N SWITCH WITH A CHARGE TRAPPING MATERIAL IN THE GATE DIELECTRIC AND A SELF-DEPLETED CHANNEL

(71) Applicant: The Hong Kong University of Science and Technology, Kowloon (HK)

(72) Inventors: Johnny Kin On Sin, Kowloon (HK); Xianda Zhou, New Territories (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 14/511,569

(22) Filed: Oct. 10, 2014

(65) Prior Publication Data
US 2015/0155375 A1    Jun. 4, 2015

Related U.S. Application Data

(60) Provisional application No. 61/963,346, filed on Dec. 2, 2013.

(51) Int. Cl.
| | |
|---|---|
| H01L 29/739 | (2006.01) |
| H01L 29/36 | (2006.01) |
| H01L 29/423 | (2006.01) |
| H01L 29/66 | (2006.01) |
| H03K 17/567 | (2006.01) |
| H01L 29/08 | (2006.01) |

(52) U.S. Cl.
CPC ......... *H03K 17/567* (2013.01); *H01L 29/0834* (2013.01); *H01L 29/4236* (2013.01); *H01L 29/66348* (2013.01); *H01L 29/7397* (2013.01)

(58) Field of Classification Search
None
See application file for complete search history.

(56) References Cited

U.S. PATENT DOCUMENTS

| | | | |
|---|---|---|---|
| 6,956,238 | B2 | 10/2005 | Ryu et al. |
| 6,992,353 | B1 | 1/2006 | Wu |
| 7,440,310 | B2 | 10/2008 | Bhattacharyya |
| 2006/0244054 | A1 | 11/2006 | Kobayashi |
| 2013/0256747 | A1 | 10/2013 | Sin et al. |

FOREIGN PATENT DOCUMENTS

| | | |
|---|---|---|
| CN | 202351722 U | 7/2012 |
| CN | 102800691 A | 11/2012 |
| CN | 103208524 A | 7/2013 |
| CN | 103258847 A | 8/2013 |

OTHER PUBLICATIONS

Nakagawa, et al., "MOSFET-mode Ultra-Thin Wafer PTIGBTs for Soft Switching Application—Theory and Experiments", Proc. ISPSD, Kitakyushu, Japan, pp. 103-106, May 2004. Retrieved on Oct. 10, 2014, 4 pages.

(Continued)

*Primary Examiner* — Seahvosh Nikmanesh
(74) *Attorney, Agent, or Firm* — Amin, Turocy & Watson, LLP

(57) ABSTRACT

The subject disclosure presents power semiconductor devices, and methods for manufacture thereof, with a low on-state voltage drop and a low turn-off energy. In an aspect, a power semiconductor device is provided that embodies a normally off trench gate-controlled p-i-n switch with a charge trapping material in the gate dielectric and a self-depleted channel.

15 Claims, 13 Drawing Sheets

(56) References Cited

OTHER PUBLICATIONS

Nakagawa, et al., "Theoretical Investigation of Silicon Limit Characteristics of IGBT", Proc. ISPSD, Naples, Italy, pp. 5-8, Jun. 2006. Retrieved on Oct. 10, 2014, 4 pages.

M. Kitagawa, et al., "A 4500 V Injection Enhanced Insulated Gate Bipolar Transistor (IEGT) Operating in a Mode Similar to a Thyristor", IEDM Tech. Dig., Washington, USA, pp. 679-682, Dec. 1993. Retrieved on Dec. 22, 2014.

M. Takei, et al., "DB (Dielectric Barrier) IGBT with Extreme Injection Enhancement", Proc. ISPSD, Hiroshima, Japan, pp. 383-386, Jun. 2010. Retrieved on Dec. 22, 2014.

Y. Onozawa, et al., "Development of the Next Generation 1700V Trench-gate FS-IGBT", Proc. ISPSD, San Diego, CA, USA, pp. 52-55, May 2011. Retrieved on Dec. 22, 2014.

Y. Haraguchi, et al., "600 V LPT-CSTBTTM on Advanced Thin Wafer Technology", Proc. ISPSD, San Diego, CA, USA, pp. 68-71, May 2011. Retrieved on Dec. 22, 2014.

Cai, et al. "A Fast Switching Insulated-Gate PIN Diode Controlled Thyristor Structure", Proc. ICSE, Penang, Malaysia, pp. 122-125, Nov. 1996.

Chang, et al. "MOS Trench Gate Field-Controlled Thyristor", IEDM Tech. Dig., Schenectady, NY, USA, pp. 293-296, Dec. 1989.

Huang, "Insulated Gate PIN Transistor—a New MOS Controlled Switching Power Device", IEEE Electron Device Letters, vol. 16, No. 9, pp. 408-410, Sep. 1995.

Zhou, et al., "A Novel SNOS Gate-Controlled, Normally-Off p-i-n. Switch," in Electron Device Letters, IEEE , vol. 35, No. 1, pp. 111-113, Jan. 2014.

Chen, et al.,"Progression of Superjunction Power MOSFET Devices," in Industrial Electronics Society, 2007. IECON 2007. 33rd Annual Conference of the IEEE , vol., no., pp. 1380-1385, Nov. 5-8, 2007.

Hatakeyama, et al., "Physical Models for SiC and Their Application to Device Simulations of SiC Insulated-Gate Bipolar Transistors," in Electron Devices, IEEE Transactions on , vol. 60, No. 2, pp. 613-621, Feb. 2013.

Martin Westmoreland, "Development of a Fault Tolerant MOS Field Effect Power Semiconductor Switching Tansistor", University of Warwick, pp. 313, Jun. 2012.

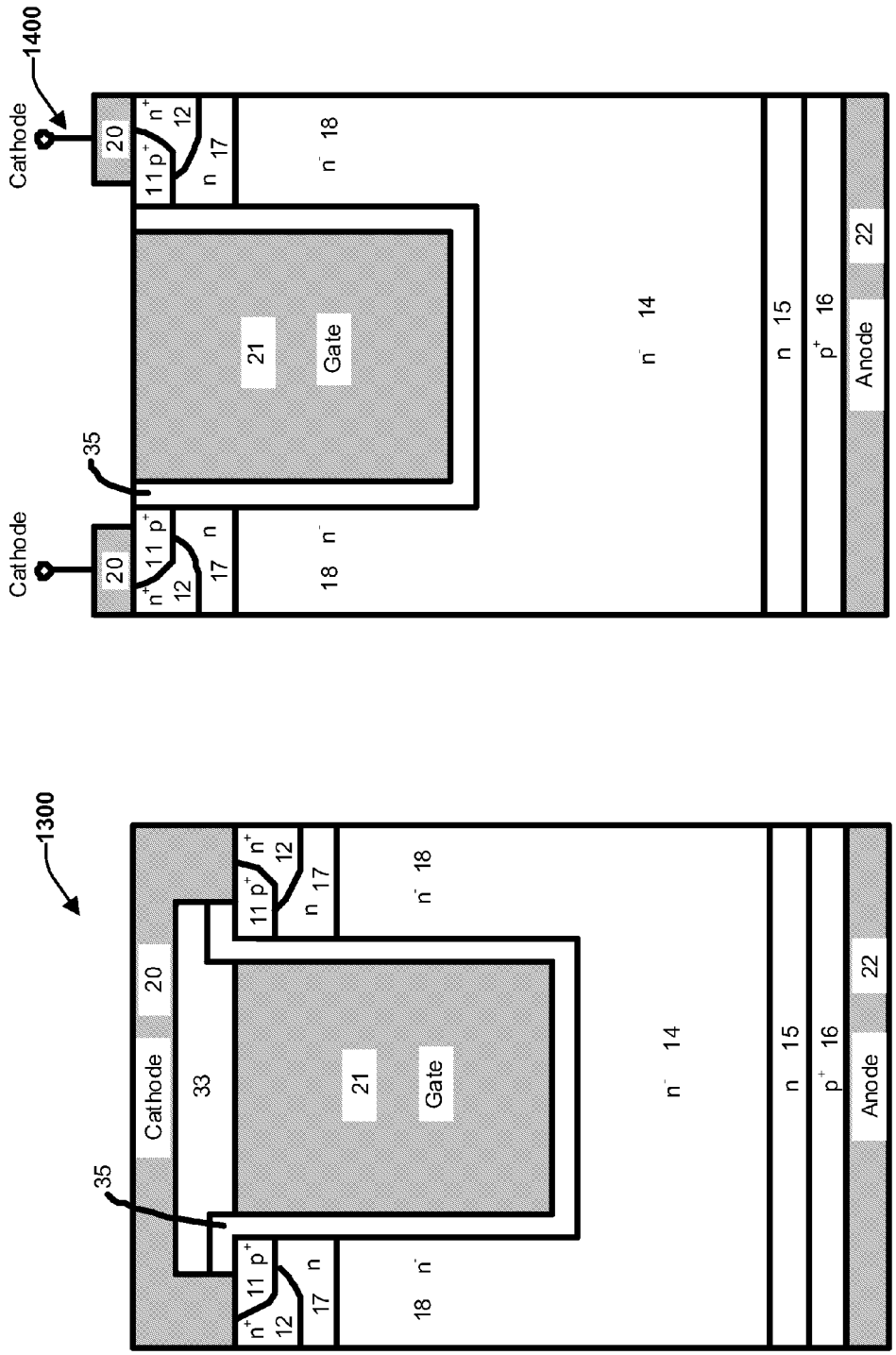

GATE-CONTROLLED P-I-N SWITCH WITH A CHARGE TRAPPING MATERIAL IN THE GATE DIELECTRIC AND A SELF-DEPLETED CHANNEL

RELATED APPLICATION

This application claims priority to U.S. Provisional Patent Application No. 61/963,346, filed on Dec. 2, 2013, and entitled "TWO-CARRIER POWER SEMICONDUCTOR FIELD EFFECT TRANSISTOR STRUCTURES WITH CHARGE TRAPPING MATERIAL IN THE GATE DIELECTRIC AND SELF-DEPLETED CHANNEL." The entirety of the aforementioned application is incorporated by reference herein.

TECHNICAL FIELD

This disclosure relates generally to power semiconductors and particularly to gate-controlled p-i-n switches having a charge trapping material in the gate dielectric and a self-depleted channel.

BACKGROUND

Power semiconductor devices are widely used as switches in power electronic systems such as motor drives and switch mode power supplies. Power semiconductor devices having low power loss are required in order to obtain a high efficiency power electronic system. In high voltage power electronic systems (e.g., wherein the input and/or output voltage is greater than 200 V), two-carrier power semiconductor devices, (also referred to as bipolar power semiconductor devices), are commonly used to achieve this target. Two-carrier power semiconductor devices that are considered in this voltage rating are the insulated gate bipolar transistor (IGBT) and the metal oxide semiconductor (MOS) gate controlled thyristor (MCT). However, it has been found that IGBT suffers from a high on-state voltage drop and high turn-off energy when scaled into high voltages (e.g., 600-6000 V). In addition, the MCT suffers from a low controllable current capability at high blocking voltage. Accordingly, existing two-carrier semiconductor devices designed for high voltage power electronic systems are inadequate.

The above-described deficiencies of conventional power semiconductor devices are merely intended to provide an overview of some of problems of current technology, and are not intended to be exhaustive. Other problems with the state of the art, and corresponding benefits of some of the various non-limiting embodiments described herein, may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

FIG. 13 presents a cross-sectional view of the formation of a power semiconductor device in accordance with aspects and embodiments described herein.

FIG. 14 presents another cross-sectional view of an example power semiconductor structure that forms a normally off gate controlled p-i-n switch with a charge trapping layer in the dielectric and a self depleted channel in accordance with aspects and embodiments described herein.

DETAILED DESCRIPTION

Figure 1:
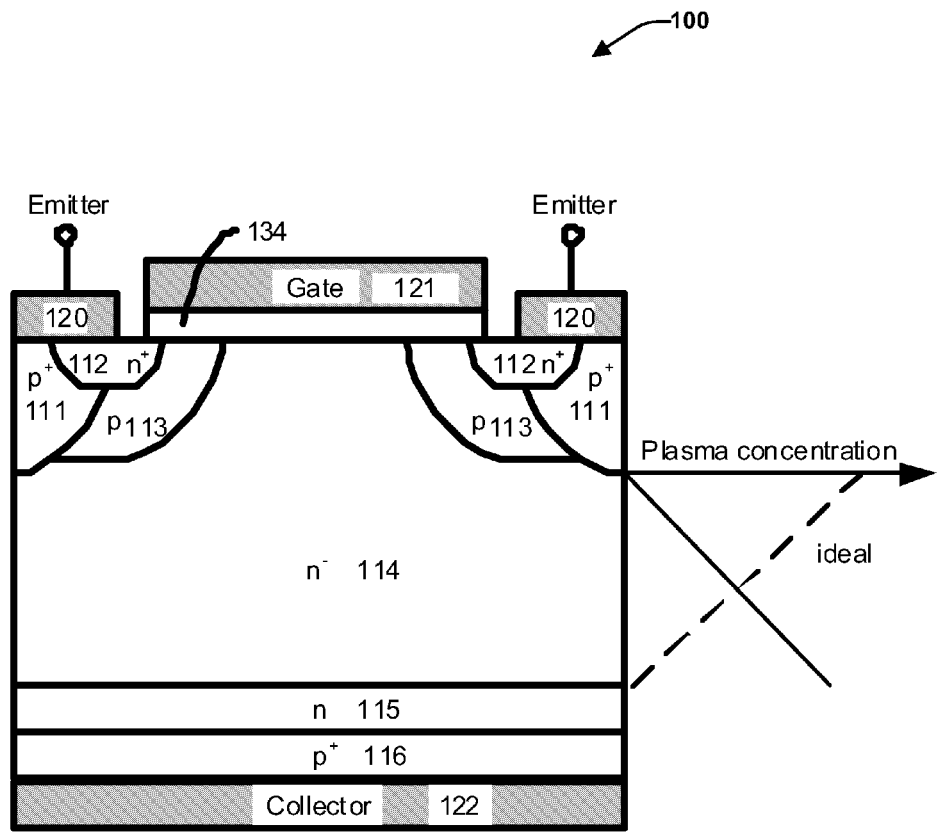
FIG. 1 presents a cross-sectional view of a prior art structure of a conventional IGBT device.

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, materials, etc. In other instances, well-known structures and devices are shown in block diagram form to facilitate describing the subject disclosure.

By way of introduction, the subject matter disclosed herein relates to power semiconductor devices with low power loss due to both a low on-state voltage drop and a low turn-off energy. To achieve this and other objects, the subject disclosure provides a normally off trench gate-controlled p-i-n switch with a charge trapping material in the gate dielectric and a self-depleted channel. The subject power semiconductors can be used as switches in various electronic systems and devices, and are particularly suited for high voltage power (e.g., wherein the input and/or output voltage is greater than 200 V) electronic systems such as motor drives and switch mode power supplies.

In an aspect, a power semiconductor structure is provided that comprises, a trench lined with a gate dielectric comprising three layers, comprising an inner layer, an outer layer, and a middle layer formed between the inner layer and the outer layer, and a gate electrode formed within the trench and adjacent to the inner layer. The structure further includes a lightly doped channel of a first conductivity type located next to a first side of the trench and adjacent to the outer layer, wherein the lightly doped channel is doped no more than a first defined doping level and a lightly doped drift region of the first conductivity type located below a second side of the trench, below the channel, and adjacent to the outer layer, wherein the lightly doped drift region is doped no more than a second defined doping level. The structures further includes a cathode region of the first connectivity type located above and adjacent to the channel, and adjacent to the outer layer, a heavily doped region of a second connectivity type located above and adjacent to the cathode region and adjacent to the outer layer, wherein the heavily doped region is doped no less than a third defined doping level, and another heavily doped region of the first connectivity type located above and adjacent to the cathode region and adjacent to the heavily doped region of the second connectivity type, wherein the other heavily doped region is doped no less than a fourth defined doping level. A cathode electrode short connects the other heavily doped region of the first connectivity type and the heavily doped region of the second conductivity type, wherein the cathode region is connected to the cathode electrode via the other heavily doped region of the first conductivity type.

In another aspect, a method for forming a power semiconductor structure is provided that includes forming a cathode region having a first conductivity type in an upper region of a silicon wafer substrate having the first conductivity type, wherein the cathode region has a higher ion concentration than the wafer substrate material. The method further includes forming a trench within the cathode region and extending into the silicon wafer substrate to establish a channel on a first side of the trench and below the cathode region and a drift region below the trench and the channel, forming gate dielectric within the trench comprising three layers, comprising an outer layer adjacent a first surface of the trench, a middle layer adjacent a second surface of the outer layer and an inner layer adjacent a third surface of the inner layer, and forming a gate electrode within the trench and adjacent to the inner layer of the gate dielectric. The method further includes forming a heavily doped region of a second connectivity type within an upper portion of the cathode region and adjacent to the outer layer of the gate dielectric, and forming another heavily doped region of the first connectivity type within the upper portion of the cathode region and adjacent to the heavily doped region of the second connectivity type, wherein the heavily doped region of the second conductivity type and the other heavily doped region of the first conductivity type respectively have higher ion concentrations than the cathode region. The method further includes forming a cathode electrode short connecting the other heavily doped region of the first conductivity type and the heavily doped region of the second conductivity type, and connecting the cathode region to the cathode electrode via the other heavily doped region of the first conductivity type.

In yet another aspect, a method is disclosed for controlling an amount of voltage provided to a device using a power semiconductor device. The power semiconductor device comprises a gate electrode formed within a trench and having a gate dielectric with a charge trapping material lining surfaces of the gate electrode within the trench, a channel of a first conductivity type and first doping concentration located next to a first side of the trench and adjacent to the gate dielectric. The power semiconductor device further includes a cathode region of the first connectivity type and a second doping concentration greater than the first doping concentration located above and adjacent to the channel and adjacent to the gate dielectric, the cathode region comprising a first doped region of a second connectivity type and a third doping concentration greater than the second doping concentration located in an upper area the cathode region and adjacent to the gate dielectric, and a second doped region of the first connectivity type and a fourth doping concentration greater than the second doping concentration located in an upper area of the cathode region and adjacent to the first doped region. The power semiconductor device further includes a cathode electrode short-connecting the first doped region and the second doped region, wherein the cathode region is connected to the cathode electrode through the second doped region, the method comprising.

The subject method includes setting the power semiconductor device to an off-state to block provision of voltage to the device, including: forming an inversion layer with a zero gate bias at a surface of the gate dielectric between the gate electrode and the first doped region based on an amount of fixed charges included in the charge trapping material; generating a build-in potential between the cathode region and the inversion layer; and establishing a fully depleted state in the channel.

The subject power semiconductor devices will now be described with reference to the drawings. Although the subject power semiconductor devices are illustrated as an n-channel power semiconductor devices, it is noted that the disclosure is equally applicable to p-channel power semiconductor devices.

With reference initially to FIG. 1, presented are a cross-sectional view of a conventional IGBT device 100 and the plasma profile of the device at the on-state. Device 100 is a MOS-controlled PNP bipolar junction transistor. Device 100 comprises a lightly doped (between $1\times10^{13}$ $cm^{-3}$ and $1\times10^{15}$ $cm^{-3}$) n⁻ drift region 114 formed over an n-buffer region 115 and a p⁺ collector region 116. The activated dose for the n-buffer 115 region is between $1\times10^{11}$ $cm^{-2}$ and $1\times10^{13}$ $cm^{-2}$, and the activated dose for the p³⁰ collector region 116 is between $1\times10^{12}$ $cm^{-2}$ and $1\times10^{14}$ $cm^{-2}$. A collector/anode electrode 122 is located below the p⁺ collector region 116. Device 100 further includes a gate dielectric layer 134 located above the n⁻ drift region 114 and a gate electrode 121 above the gate dielectric. The gate dielectric 134 is a single layer of insulator, typically silicon oxide.

Device 100 further includes a p-base 113 that is generally formed by ion-implantation and annealing. The typical peak doping concentration of the p-base 113 of the common IGBT is between $1\times10^{16}$ cm$^{-3}$ and $1\times10^{18}$ cm$^{-3}$. The p-base 113 includes a heavily doped (between $1\times10^{18}$ cm$^{-3}$ and $1\times10^{21}$ cm$^{-3}$) p+ region 111 and a heavily doped (between $1\times10^{18}$ cm$^{-3}$ and $1\times10^{21}$ cm$^{-3}$) n$^+$ source region 112. The p-base 113 is connected to an emitter/source electrode 120 through the heavily doped p$^+$ region 111.

The channel of the device 100 is at the surface of the p-base 113 between the heavily doped n$^+$ region 112 and the lightly doped n$^-$-drift region 114. The n-buffer 115 region and the p$^+$ collector region 116 are located at the backside of the device and are typically formed by ion implantation and annealing. The gate electrode 121 and emitter electrode 120 are located at the front side of the device 100, and the collector electrode 122 is located at the backside.

IGBT device 100 is a MOS-controlled PNP bipolar junction transistor. The on-state and off-state of the device are determined by the on-state and off-state of the MOS channel, respectively. Power loss associated with operation of IGBT device 100 is mainly composed of conduction loss and switching loss. The conduction loss is usually characterized by the on-state voltage drop, and the switching loss is usually characterized by the turn-off energy. The on-state voltage drop associated with conventional IGBT device 100 is often reduced by increasing the concentration of the non-equilibrium plasma of electrons and holes in the n$^-$-drift region 114 at the on-state. The high concentration of the plasma is obtained by using a p$^+$-collector 116/n-buffer 115 junction with high injection efficiency at the backside of the device.

However, when using a p$^+$-collector 116/n-buffer 115 junction with high injection efficiency at the backside of the device, the collector current is dominated by hole current while only a small portion of the collector current is electron current. As a result, removal of the plasma to accomplish turning off of device 100 is limited by the removal of electrons. Moreover, a large amount of holes are injected into the n$^-$-drift region 114 during the turn-off which further slows down the removal of the plasma. Due to the slow removal of the plasma, a high turn-off energy is consumed. In order to reduce both the on-state voltage drop and the turn-off energy, a high concentration of the plasma at the on-state and a p$^+$-collector 116)/n-buffer 115 junction with low injection efficiency are required at the same time. To fulfill these two requirements, the concentration of the plasma at the on-state should be high at the front side of the device and low at the backside of the device.

Unfortunately, this ideal plasma profile at the on-state cannot be achieved in the conventional IGBT device 100. In particular, the junction at the p-base 113/n$^-$-drift region 114 is slightly reverse biased when current flows through the n$^-$-drift region 114 at the on-state. In addition a build-in potential of the junction at the p-base 113/n$^-$-drift region 114 causes holes to drift into the p-base 113 at the on-state. As a result, during the on-state of the device 100, the concentration of holes at the junction is approximately zero and the concentration of the plasma at/near the junction is low. In order to maintain the conductivity modulation in the n$^-$-drift region 114 at the on-state when the concentration of holes at the junction is approximately zero and the concentration of the plasma at/near the junction is low, a relatively high injection efficiency is required at the backside p$^+$-collector 116/n-buffer 115 junction. However, as noted above a relatively high injection efficiency at the backside results in increased turn-off energy compared with the ideal case.

Figure 2:
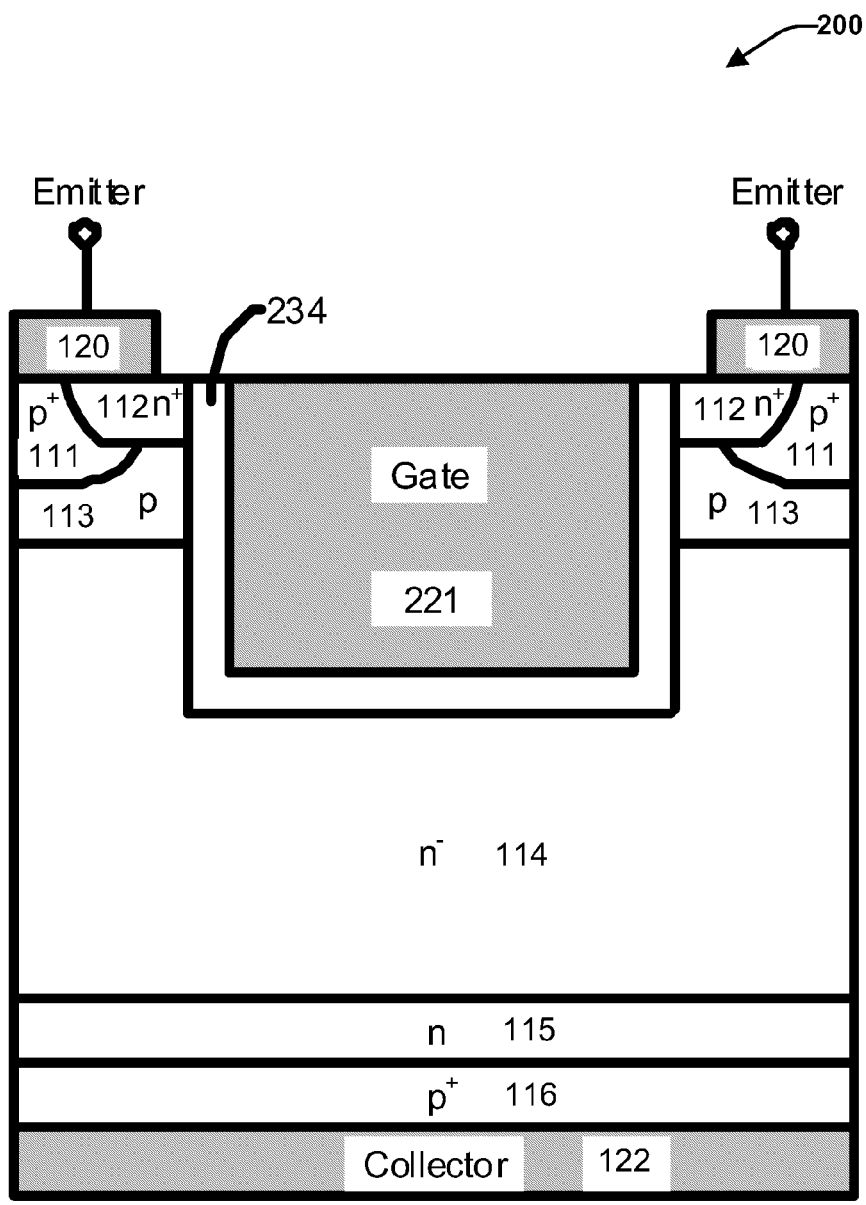
FIG. 2 presents a cross-sectional view of another prior art structure of a conventional IGBT device.

FIG. 2 presents a cross-sectional view of another conventional IGBT device 200. IGBT device 200 is similar to IGBT device 100 except the gate electrode 221 of device 200 is located within a trench. The gate dielectric 234 lines the surface of the gate electrode within the trench and includes a single layer of insulator, typically silicon oxide. The depth of the trench is generally between 1 μm and 10 μm. The aspect ratio (depth/width) of the trench is dependent on the fabrication capability, and the typical aspect ratio of the trench is from 1 to 20. The rest of the structure of IGBT device 200 is the same as that of the planar IGBT device 100. Repetitive description of like elements employed in respective embodiments of devices and methods described herein is omitted for sake of brevity.

A trench gate electrode 221 is employed in some IGBT devices to alleviate the undesirable effect caused by the slightly reverse biased p-base 113/n$^-$-drift region 114 junction discussed above. In particular, usage of the trench gate reduces the area of the p-base 113/n$^-$-drift region 114 junction to minimize the effects of the reverse biased p-base 113/n$^-$-drift region 114 junction. However, the deleterious effects associated with the p-base 113/n$^-$-drift region 114 junction cannot be eliminated entirely given that the p-base 113/n$^-$-drift region 114 junction exists in all IGBT structures.

Figure 3:
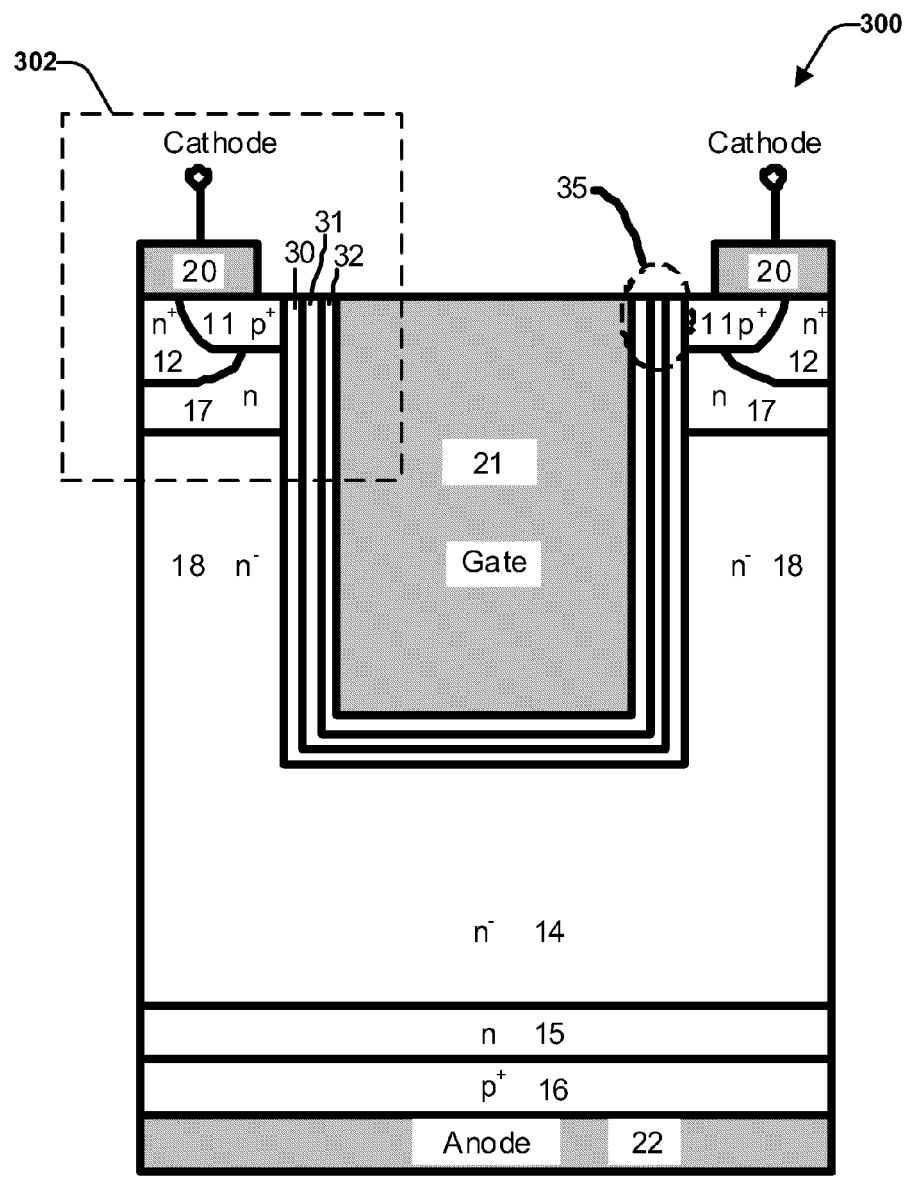
FIG. 3 presents a cross-sectional view of an example power semiconductor structure that forms a normally off gate controlled p-i-n switch with a charge trapping layer in the dielectric and a self depleted channel in accordance with aspects and embodiments described herein.

Turning now to FIG. 3, presented is a cross-section of power semiconductor device 300 that forms a gate-controlled p-i-n switch having a charge trapping material in the gate dielectric and a self-depleted channel in accordance with various aspects and embodiments described herein. Repetitive description of like elements employed in respective embodiments of devices and methods described herein is omitted for sake of brevity.

Device 300 includes a gate electrode 21 formed within a trench. Surfaces of the gate electrode 21 within the trench are lined with a gate dielectric 35. A lightly doped n$^-$ 18 channel is formed along opposite sides of the trenched gate electrode 21 and adjacent to the gate dielectric 35. A doped n-cathode region 17 is formed above and adjacent to the channel n$^-$ 18 channel and adjacent to the gate dielectric 35. The peak doping concentration of the n-cathode region 17 is higher than that of the n$^-$-channel 18. A heavily doped p$^+$-region 11 is formed above (e.g., in an upper area of) the n-cathode region 17 and adjacent to the gate dielectric, and a heavily doped n$^+$-region 12 is formed above (e.g., in an upper area of) the n-cathode region 17 and adjacent to the p$^+$-region 11. A cathode electrode 20 short-connects the heavily doped p$^+$-region 11 and the heavily doped n$^+$-region 12. In an aspect, the cathode electrode 20 is aluminum.

In another aspect, the cathode electrode 20 can include any suitable metal, including but not limited to tungsten, copper, titanium nitride, titanium silicide, cobalt silicide and nickel silicide. A thickness of the cathode electrode 20 can vary be from about 0.1 μm to about 20 μm. In an embodiment, the gate electrode 21 is at least one of poly-silicon, metal or metal silicide. In an aspect, the thickness of the gate electrode 21 is from about 10 nm to about 2000 nm.

On the backside of the device, an n$^-$-drift region 14 is formed below the trench gate electrode 21 and n$^-$-channel 18. An n-buffer region 15 is located adjacent to and below the n$^-$-drift region 14, and a p$^+$-anode region 16 is located adjacent to and below the n-buffer region 15. An anode electrode 22 is further formed adjacent to and below the p$^+$-anode region 16. With this backside configuration, device 300 takes a punch though configuration. However, it should be appreciated that device 300 can be formed with a non-punch through (NPT) backside design. The NPT backside design has a relatively thicker n⁻-drift region 14 compared to that shown in FIG. 3. With the thicker n⁻-drift region 14, the n-buffer 15 region is removed.

The gate dielectric 35 is composed of three layers, a first or outer layer 30 lining the surface of the trench, a second or middle layer 31 formed on the outer layer 30, and a third or inner layer 32 form on the second or middle layer 31. In an aspect, the three layers of the gate dielectric can form an oxide, nitride, oxide (ONO) layer, wherein the middle layer 31 is a nitride based charge trapping layer. For example, the middle layer 31 can include a fixed amount of charged ions (e.g., negative ions). The amount of fixed charges included in the charge trapping layer 31 can be selected to achieve a specifically desired threshold voltage for device 300.

In an aspect the first or outer layer 30 of the gate dielectric 35 includes silicon oxide. The thickness of the first layer 30 can vary. In an aspect, the thickness of the first layer 30 is from 0.1 nm to 20 nm. In another aspect, the thickness of the first layer is from 1.0 nm to 10 nm. Still in yet another aspect, the thickness of the first layer is from 3.0 nm to 7.0 nm. The second layer 31 of the gate dielectric 35 includes a charge trapping material such as silicon nitride, silicon nanocrystal or a combination of these two materials. The thickness of the second layer 31 can vary. In an aspect, the thickness of the second layer 31 is from 1 nm to 100 nm. In another aspect, the thickness of the second layer 31 is from 20 nm to 80 nm. In yet another aspect, the thickness of the second layer 31 is from 40 nm to 60 nm. The third layer 32 of the gate dielectric 35 can include but is not limited to: silicon oxide, aluminum oxide or a combination of these materials. In an aspect, the third layer 32 includes a bottom silicon oxide on the surface of the second layer 31 and a top aluminum oxide formed over the bottom silicon oxide. The thickness of the third layer 32 can vary. In an aspect, the thickness of the third layer 32 is from 10 nm to 200 nm. In another aspect, the thickness of the third layer 32 is from 50 nm to 150 nm. In yet another aspect, the thickness of the third layer 32 is from 75 nm to 125 nm.

The gate electrode 21 is located within the trench. The depth of the trench can vary. In an aspect, the depth of the trench is between 1 μm and 15 μm. In another aspect, the depth of the trench is between 2 μm and 10 μm. Still in yet another aspect, the depth of the trench is between 4 μm and 8 μm. The aspect ratio (depth/width) of the trench is variably depending on fabrication capability. In an aspect, the aspect ratio of the trench is from 1 μm to 20 μm. In another aspect, the aspect ratio of the trench is from 5 μm to 15 μm.

The heavily doped p⁺ region 11 and the heavily doped n⁺ region 12 respectively have a doping concentration between $1 \times 10^{18}$ cm⁻³ and $1 \times 10^{21}$ cm⁻³. The doping concentrations of the p⁺ region 11 and the n⁺ region 12 can be similar or different. The peak doping concentration of the n-cathode region 17 is less than the doping concentrations of the p⁺ region 11 and the n⁺ region 12 between $1 \times 10^{16}$ cm⁻³ and $1 \times 10^{19}$ cm⁻³, yet higher than that of the n⁻-channel 18. In an aspect, the doping concentration of the n-cathode region is between $1 \times 10^{16}$ cm⁻³ and $1 \times 10^{19}$ cm⁻³. The doping concentration of the n⁻-channel 18 is typically the same or similar to that of the n⁻-drift region 14. The doping concentration of the n⁻-drift region 14 is dependent on the breakdown voltage rating of the device 300. In an aspect, the doping concentration of the n⁻-channel 18 and n⁻-drift region 14 is between $1 \times 10^{13}$ cm⁻³ and $1 \times 10^{15}$ cm⁻³. The n-buffer 15 and the p⁺-anode (16) are located at the backside, and they are typically formed by ion implantation and annealing. The activated dose for the n-buffer 15 is between $1 \times 10^{11}$ cm⁻² and $1 \times 10^{13}$ cm⁻², and the activated dose for the p⁺-anode 16 is between $1 \times 10^{12}$ cm⁻² and $1 \times 10^{14}$ cm⁻².

Device 300 is configured to rest at a normally off-state (e.g., with a zero gate bias or gate bias below the threshold voltage). At the off-state, negative fixed charges are created in the charge trapping material 31 of the gate dielectric 35 and a p-type inversion layer is formed at the sidewall surface of the silicon mesa (e.g., on the surface of the outer layer 30 of the gate dielectric adjacent to the n⁻-channel and the n⁻-cathode region 17). The p-type inversion layer is connected to the cathode electrode 20 through the heavily doped p³⁰ region 11. The n-cathode region 17 is connected to the cathode electrode 20 through the heavily doped n⁺ region 12.

Figure 4:
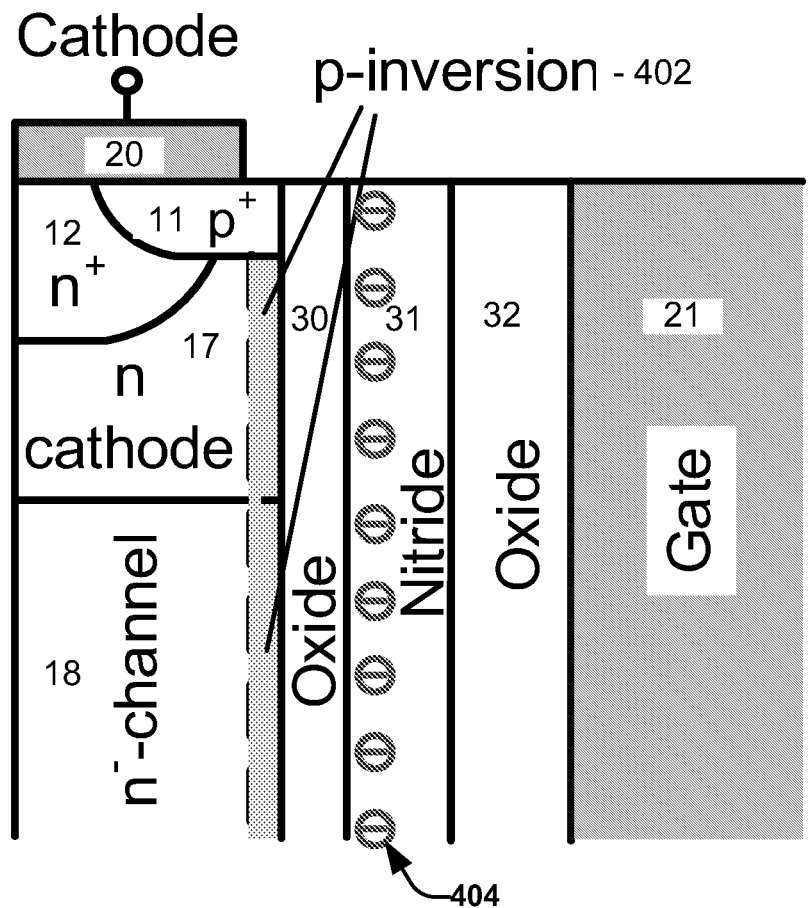
FIG. 4 presents an enlarged view of a portion of an example power semiconductor structure that forms a normally off gate controlled p-i-n switch with a charge trapping layer in the dielectric and a self depleted channel in accordance with aspects and embodiments described herein.

FIG. 4 presents an enlarged view of a portion of device 300 corresponding to call out box 302. As seen in FIG. 4, the gate dielectric is composed of an ONO layer, wherein the outer layer 30 includes oxide, the middle layer 31 includes nitride, and the inner layer 32 includes oxide. At the off-state (e.g., with a zero-gate bias), negative fixed charges 404 are formed in the nitride layer 31 of the gate dielectric 35 and a p-type inversion layer 402 is formed at or near the surface of the oxide layer 30 of the gate dielectric 35 and adjacent to the n⁻-channel and the n⁻-cathode region 17. The p-type inversion layer 402 is connected to the cathode electrode 20 through the heavily doped p⁺ region 11. The n-cathode region 17 is connected to the cathode electrode 20 through the heavily doped n⁺ region 12.

When operating as a switch, power semiconductor device 300 achieves low power loss compared to that of a conventional IGBT device (e.g., device 100 and device 200) due to both a low on-state voltage drop and a low turn-off energy. The structure of device 300 embodies a normally off trench gate-controlled p-i-n switch with a charge trapping material in the gate dielectric and a self-depleted channel. When device 300 in an off-state, a build-in potential exists between the n-cathode region 17 and the p-type inversion layer 402. This build-in potential causes the lightly doped n⁻-channel 18 to be fully depleted (e.g., having no free charge carriers). Accordingly, when the gate bias is below the threshold voltage required to turn device 300 on, (e.g., a zero gate bias), the n⁻-channel 18 of device 300 is self-depleted. The off-state of device 300 is the result of the self-depleted state of the n⁻-channel 18.

When device 300 is switched from the off-state to an on-state, via application of a positive voltage to the gate electrode 21 greater than or equal to the threshold voltage, the p-type inversion layer 402 is transferred or transformed to an n-type accumulation layer (not shown). As the p-type inversion layer is transferred to the n-type accumulation layer, the charge state of the self-depleted n⁻-channel 18 becomes neutral (e.g., the amount of electrons and holes reach equilibrium). As a result, the n⁻-channel 18 is placed into a conducting state (from an non-conducting state when device 300 is in the off-state) and the on-state current is allowed to flow through the n⁻-channel 18.

When operating in an on-state, because the doping concentration of the n-cathode region 17 is higher than that of the n⁻-channel 18, a build-in potential is generated at the of the n/n⁻ junction of the n-cathode region 17 and the n⁻-channel 18. This build-in potential prevents or substantially blocks the drift of holes away from the n/n⁻ junction (e.g., into the n⁻-channel 18 and the n-drift region 17). As a result, the concentration of plasma (e.g., the non-equilibrium concentration of electrons and holes) can be extremely high (e.g., in the order of $10^{17}$ cm⁻³) near the n/n-junction. This high plasma concentration can provide sufficient conductivity modulation in the lightly doped n⁻-channel 18 and n⁻-drift region 14 while reducing the injection efficiency of the backside p⁺-anode 16/n-buffer 15 junction. The reduction in injection efficiency is a direct result of the increase in concentration of plasma near the n/n-junction. In particular, as the plasma concentration near the n/n-junction increases, the injection efficiency of the backside p⁺-anode 16/n-buffer 15 junction decreases. With a reduced backside injection efficiency and high concentration of plasma at or near the n/n⁻ junction of the n-cathode region 17 and the n⁻-channel 18 at the on-state, device 300 achieves both a low on-state voltage drop and a low turn-off energy.

Moreover, when device 300 is in the on-state, the n⁻-channel 18 is in parallel with the n-type accumulation layer (not shown). Accordingly, the on-state current can flow through the conductivity modulated n⁻-channel 18 even without the n-type accumulation layer. Thus a gate bias which is even slightly higher than the threshold voltage is enough to fully turn on the device 300. A large over-drive voltage on the gate electrode is not necessary to turn on device 300. This quality of device 300 enables device 300 to have a high threshold voltage (e.g., around 7V). A high threshold voltage is desirable for power semiconductors to protect them from accidental turn-on events. For example, accidental turn-on events associated with power semiconductors employed as switches are caused by an uncontrollable rise of the gate voltage under transient conditions, such as fast rise of the anode voltage or voltage spike from the gate drive circuit. With a high threshold voltage, the likelihood of an accidental turn on event is minimized, thus improving the device reliability of device 300.

Furthermore, the threshold voltage of device 300 is directly related to the amount of trapped negative fixed charges in the charge trapping layer 31 of the gate dielectric. This property of device 300 enables device 300 to be made with an accurately controlled/programmed threshold voltage, a quality that has been difficult to be achieve in other two-carrier power semiconductor devices due to process variations. An accurately controlled/programmed threshold voltage enables multiple devices power semiconductor devices, such as device 300, to be connected in parallel in a power module with a uniform on-state current distribution. For example, in an IGBT module, different IGBTs are connected in parallel. In order to obtain a uniform current distribution in the module at the on-state, the threshold voltage of the different IGBTs should be kept the same. This goal can be challenging due to process variations. However, the threshold voltages of a plurality of devices 300 connected in parallel can be programmed to have the same value. Therefore, due to the various structural characteristics of device 300 described herein, device 300 embodies a gate-controlled p-i-n switch with an electrically programmable threshold voltage ($V_{TH}$).

FIGS. 5-14 present an example fabrication process for a power semiconductor device (such as device 300) embodied as a normally off trench gate controlled p-i-n switch in accordance with an embodiment of the subject disclosure. The key fabrication process steps of include: 1) forming the n-cathode region 17 in an n⁻ silicon wafer substrate by ion implantation and annealing, 2) etching the trench, 3) forming the gate dielectric 35 containing a charge trapping material layer 31, 4) depositing and etching the poly-silicon of the gate electrode 21, 5) forming the p+ region 11 and the n+ region 12 by high dose ion implantation and annealing, 6) forming the contact hole by depositing an isolation dielectric layer 33 and patterning, 7) forming the cathode electrode 20 by depositing a metal layer and patterning, 8) thinning down the n⁻ substrate wafer and then forming the backside n-buffer 15 and p⁺-anode 16 by ion implantation and annealing, and 9) forming the anode electrode 22 by depositing a metal layer at the backside.

Although FIGS. 5-14 demonstrate formation of an n-channel power semiconductor device, it is noted that the disclosure is equally applicable to p-channel power semiconductor devices. Accordingly, it should be appreciated that the conductivity types of the various different n and p components of the semiconductor structures described herein can be flipped. Formation of the disclosed semiconductor devices begins with a silicon wafer substrate.

Figure 5:
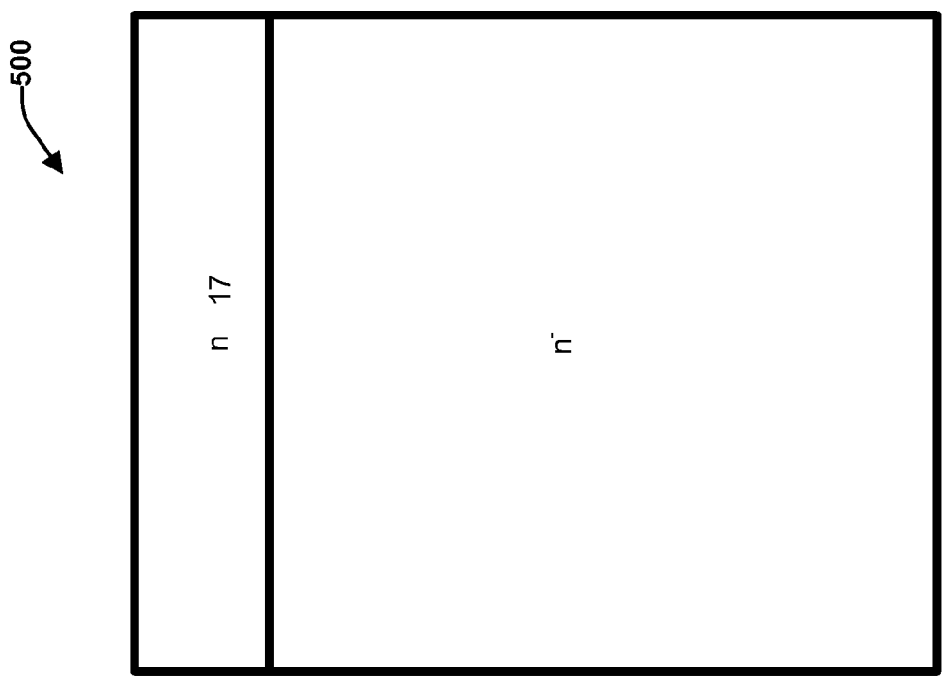
FIG. 5 presents a cross-sectional view of the formation of a power semiconductor device in accordance with aspects and embodiments described herein.

FIG. 5 presents an initial structure 500 composed an n⁻ silicon substrate wafer substrate with an n-cathode region 17 formed in an upper portion of the n⁻ silicon wafer substrate. In an aspect, the n⁻ silicon substrate wafer substrate is lightly doped (between $1\times10^{13}$ cm⁻³ and $1\times10^{15}$ cm⁻³). The n-cathode region 17 is formed by ion implantation and annealing. The typical dose for the n-cathode region 17 is between $1\times10^{12}$ cm⁻² and $1\times10^{15}$ cm⁻². The thickness and width of the initial n⁻ silicon substrate wafer substrate can vary. In an aspect, the thickness of the initial n⁻ silicon substrate wafer substrate is between 10 µm and 200 µm. In another aspect, the thickness of the initial n⁻ silicon substrate wafer substrate is between 30 µm and 150 µm. In another aspect, the thickness of the initial n⁻ silicon substrate wafer substrate is between 50 µm and 100 µm. In an aspect, the width of the initial n⁻ silicon substrate wafer substrate is between 10 µm and 100 µm. In another aspect, the width of the initial n⁻ silicon substrate wafer substrate is between 20 µm and 50 µm.

Figure 6:
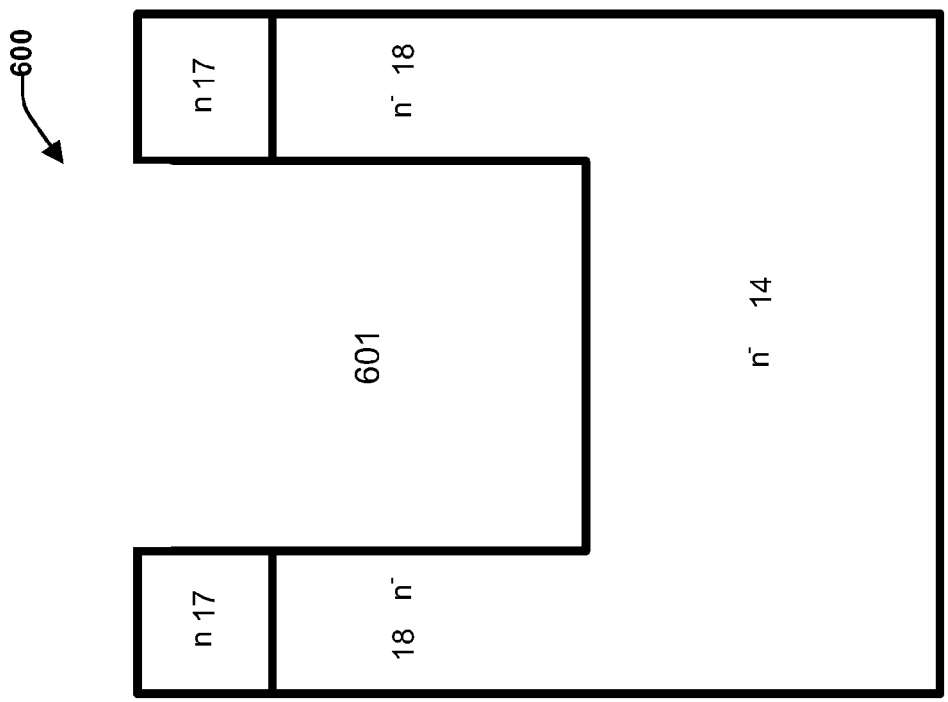
FIG. 6 presents a cross-sectional view of the formation of a power semiconductor device in accordance with aspects and embodiments described herein.

FIG. 6 shows the transition of structure 500 to intermediate structure 600 with the formation of a trench 601 through the n-cathode region 17 and into the n⁻ silicon substrate wafer substrate. The trench is formed by anisotropic etching. In an aspect, etching of the trench 601 is performed via deep reactive ion etching. The depth of the trench 601 can vary. In an aspect, the depth of the trench 601 is between 1 µm and 15 µm. In another aspect, the depth of the trench 601 is between 2 µm and 10 µm. Still in yet another aspect, the depth of the trench 601 is between 4 µm and 8 µm. The aspect ratio (depth/width) of the trench 601 is variably depending on fabrication capability. In an aspect, the aspect ratio of the trench is from 1 µm to 20 µm. In another aspect, the aspect ratio of the trench is from 5 µm to 15 µm. Formation of the trench 601 results in the generation of n⁻-channels 18 on either sides of the trench. Thus after etching of the trench 601, the semiconductor mesa structure 600 is composed of a top n-cathode region 17, n⁻-channels 18 located on opposing sides of the trench, and a n⁻-drift region 14 located under both the trench and the n⁻-channels 18.

Figure 7:
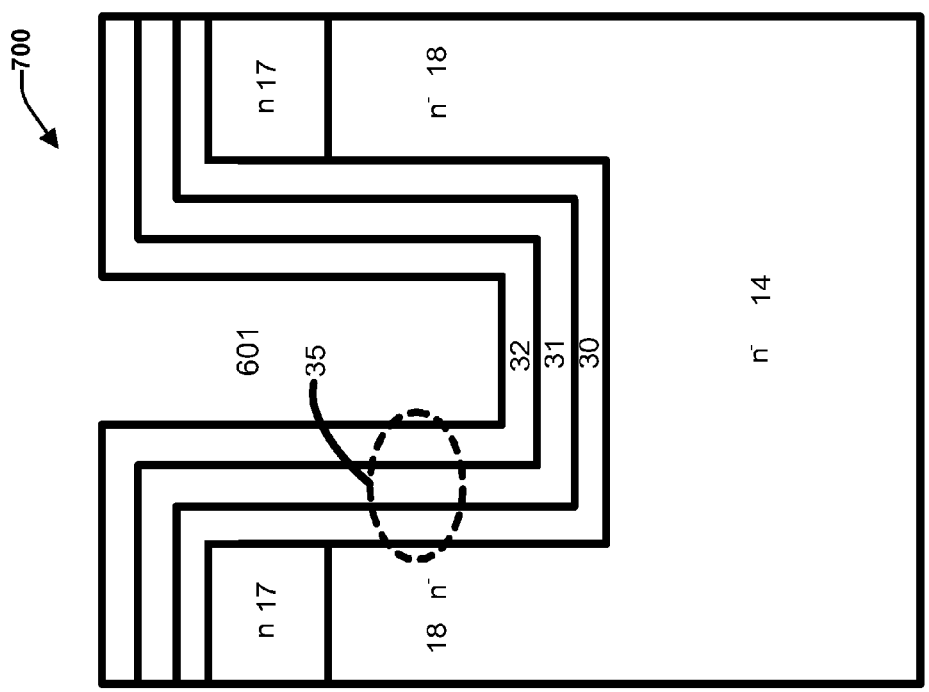
FIG. 7 presents a cross-sectional view of the formation of a power semiconductor device in accordance with aspects and embodiments described herein.

FIG. 7 shows the transition of structure 600 to intermediate structure 700 with the formation of the gate dielectric 35 within the trench 601. Typically, the first or outer layer 30 of the gate dielectric 35 is silicon oxide, and the typical thickness of the first layer 30 is from 1.0 nm to 10.0 nm. In an aspect, the first layer 30 is formed by dry oxidizing the silicon surface of the silicon substrate. In another aspect, the first layer 30 is formed via native oxide on the silicon surface of the silicon substrate.

After the first layer 30 of the gate dielectric 35 is formed, the second or middle layer 31 is formed on top of the first layer 30. The second layer 31 of the gate dielectric 35 includes a charge trapping material 31. The typical thickness of the second layer 31 is from 1 nm to 100 nm. In an aspect, the second layer 31 of the gate dielectric is silicon nitride formed via chemical vapor deposition. In another aspect, the second layer of the gate dielectric 35 is silicon nanocrystal formed by chemical vapor deposition. In another aspect, the second layer 31 of the gate dielectric 35 is a combination of silicon nitride and silicon nanocrystal, and both of these materials are formed by chemical vapor deposition.

In yet another aspect, the second 31 layer of the gate dielectric 35 includes silicon nanocrystal formed by silicon ion implantation after the formation of the third layer 32 of the gate dielectric 35. In another aspect, the second layer 31 of the gate dielectric is a combination of silicon nitride formed by chemical vapor deposition before the formation of the third layer 32 of the gate dielectric 35, and silicon nanocrystal formed by silicon ion implantation after the formation of the third layer 32 of the gate dielectric 35.

The third or inner layer 32 of the gate dielectric 35 is formed on top of the second layer 31. The typical thickness of the third layer 32 is from 10 nm to 200 nm. In an aspect, the third layer 32 of the gate dielectric 35 includes silicon oxide formed by oxidizing the surface of the charge trapping material of the second layer 31. In another aspect, the third layer 32 of the gate dielectric 35 includes silicon oxide formed by chemical vapor deposition. In another aspect, the third layer 32 of the gate dielectric 35 includes aluminum oxide formed by atomic layer deposition. In another aspect, the third layer 32 of the gate dielectric 35 is composed of a bottom layer of silicon oxide formed by oxidizing the charge trapping material of the second layer 31, and a top layer of aluminum oxide formed by atomic layer deposition. In yet another aspect, the third layer 32 of the gate dielectric 35 is composed of a bottom layer of silicon oxide formed by chemical vapor deposition and a top layer of aluminum oxide formed by atomic layer deposition.

Figure 8:
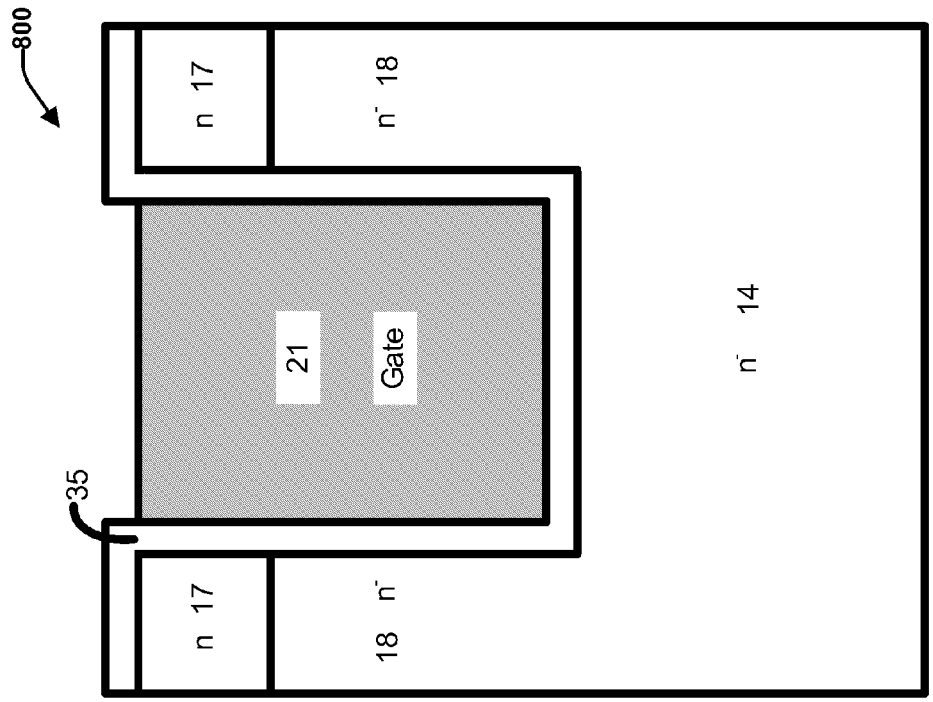
FIG. 8 presents a cross-sectional view of the formation of a power semiconductor device in accordance with aspects and embodiments described herein.

FIG. 8 shows the transition of structure 700 to intermediate structure 800 with the formation of the gate electrode 21 within the trench 601. It should be appreciated that gate dielectric 35 of structure 800 is depicted as a single layer merely for ease of illustration and that gate dielectric 35 represents the three layer gate dielectric depicted in structure 700. In an aspect, the gate electrode 21 includes poly-silicon and is formed by isotropic deposition (e.g., chemical vapor deposition) and anisotropic etching (e.g., reactive ion etching). In another aspect, after the formation of the p⁺ region 11 and n⁺ region 12 discussed with respect to FIG. 9, the poly-silicon of the gate electrode 21 is transferred to metal or metal silicide, including but not limited to aluminum, tungsten, copper, titanium silicide, cobalt silicide and nickel silicide.

Figure 9:
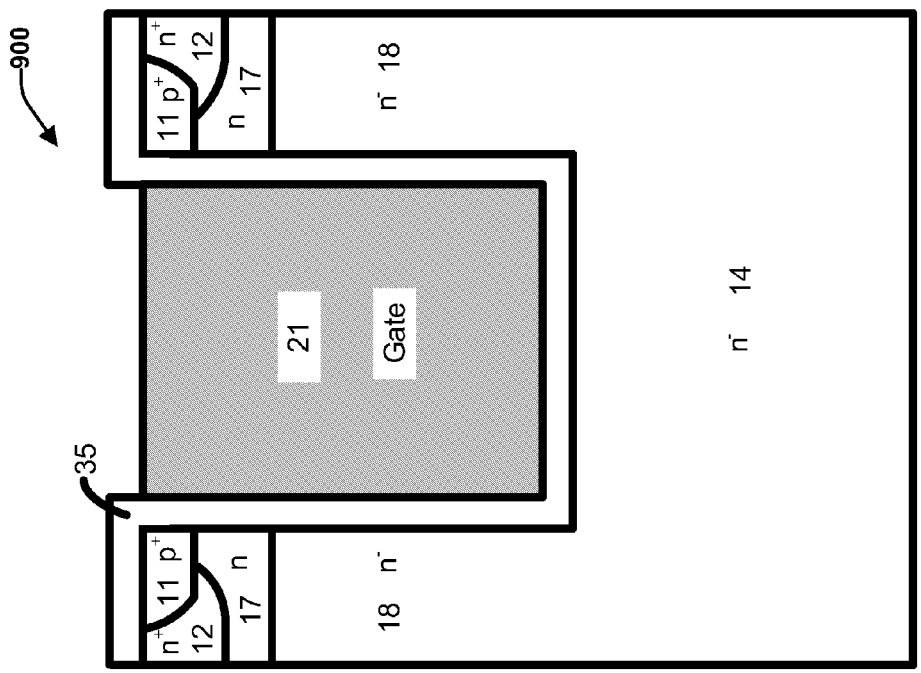
FIG. 9 presents a cross-sectional view of the formation of a power semiconductor device in accordance with aspects and embodiments described herein.

FIG. 9 shows the transition of structure 800 to intermediate structure 900 with the formation of the p⁺ region 11 and the n⁺ region 12. In an aspect, the n⁺ region 12 is formed by high dose (e.g., from $1\times10^{14}/cm^2$ to $1\times10^{16}/cm^2$) n-type ion implantation and annealing, and the p⁺ region 11 is formed by high dose (e.g., from $1\times10^{14}/cm^2$ to $1\times10^{16}/cm^2$) p-type ion implantation and annealing. In another aspect, annealing is carried out after both the p-type ion implantation and n-type ion implantation to form the p⁺ region (11) and $n^{30}$ region (12).

Figure 10:
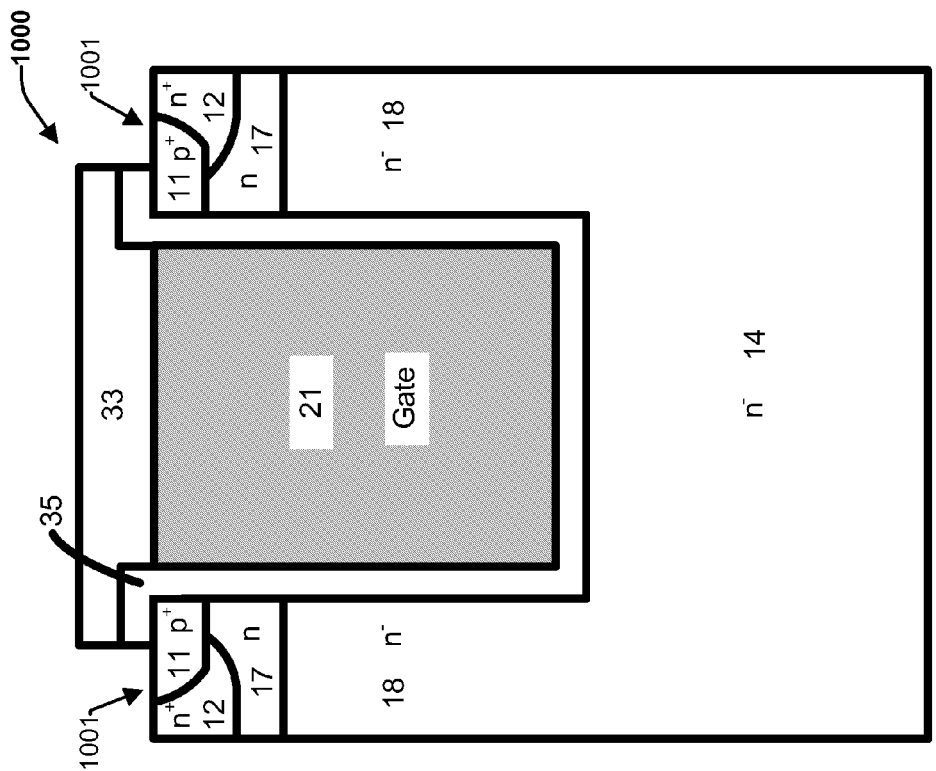
FIG. 10 presents a cross-sectional view of the formation of a power semiconductor device in accordance with aspects and embodiments described herein.

FIG. 10 shows the transition of structure 900 to intermediate structure 1000 with the formation of contact holes 1001 over surfaces of the p⁺ region 11 and the n⁺ region 12. In an aspect the contact holes 1001 are formed by depositing an isolation dielectric layer 33 over the gate electrode 21 and the portion of the gate dielectric 35 covering the p⁺ region 11 and the n⁺ region 12. The isolation dielectric 33 and gate dielectric 35 are then pattered (e.g., via etching) to form the contact holes 1001. The typical thickness of the isolation dielectric 33 is from 100 nm to 1000 nm. In an aspect, the isolation dielectric 33 is silicon oxide formed by chemical vapor deposition or plasma enhanced chemical vapor deposition.

Figure 11:
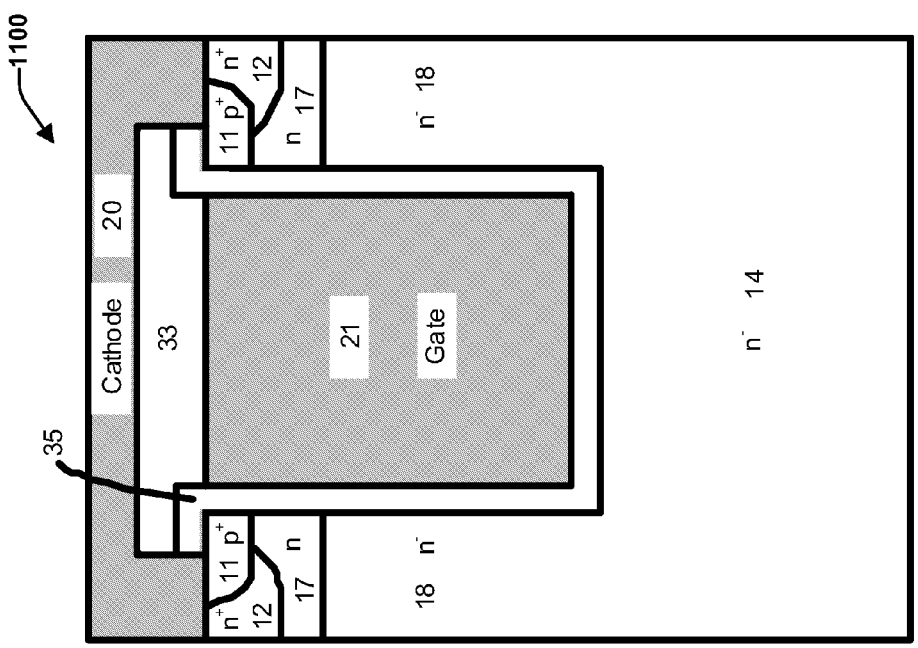
FIG. 11 presents a cross-sectional view of the formation of a power semiconductor device in accordance with aspects and embodiments described herein.

FIG. 11 shows the transition of structure 1000 to intermediate structure 1100 with the formation of the cathode electrode 20 by deposition and then patterning. The typical thickness of the cathode electrode 20 is from 0.1 μm to 20 μm. The cathode electrode can include is metal or metal silicide, including but not limited to aluminum, tungsten, copper, titanium silicide, cobalt silicide and nickel silicide.

Figure 12:
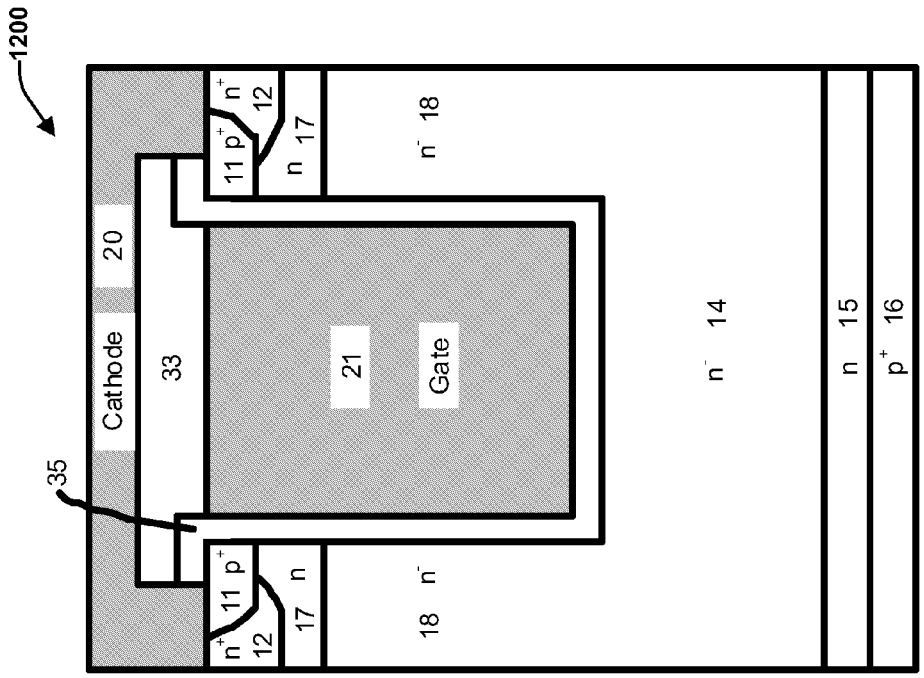
FIG. 12 presents a cross-sectional view of the formation of a power semiconductor device in accordance with aspects and embodiments described herein.

FIG. 12 shows the transition of structure 1100 to intermediate structure 1200 with the formation of backside n-buffer 15 and the p⁺-anode region 16. In an aspect, the backside of the n⁻ silicon wafer substrate is first thinned down (e.g., via polishing) prior to formation of the n-buffer 15 and the p⁺-anode region 16. In an aspect, the n-buffer 15 is formed by n-type ion implantation and annealing, and the p⁺-anode 16 is formed by p-type ion implantation and annealing. In another aspect, annealing is carried out after both the n-type ion implantation and p-type ion implantation to form the n-buffer 15 and p⁺-anode region 16. The implantation doses for the n-buffer 15 and p⁺-anode 16 are dependent on the annealing temperature. Usually the activated dose for the n-buffer 15 is between $1\times10^{11}$ cm⁻² and $1\times10^{13}$ cm⁻², and the activated dose for the p⁺-anode 16 is typically between $1\times10^{12}$ cm⁻² and $1\times10^{14}$ cm⁻².

FIG. 13 shows the transition of structure 1200 to intermediate structure 1300 with the formation of the anode electrode 22 at the backside p⁺-anode 16 region by deposition. The anode electrode 22 can include a metal or metal silicide, including but not limited to aluminum, tungsten, copper, titanium silicide, cobalt silicide and nickel silicide.

FIG. 14 shows the transition of structure 1300 to a finished power semiconductor device 1400 in accordance with aspects and embodiments described herein. As seen in FIG. 14, the cathode electrodes are defined via patterning and removal of the isolation dielectric. In an aspect, semiconductor device 1400 is analogous to semiconductor device 300.

Figure 15:
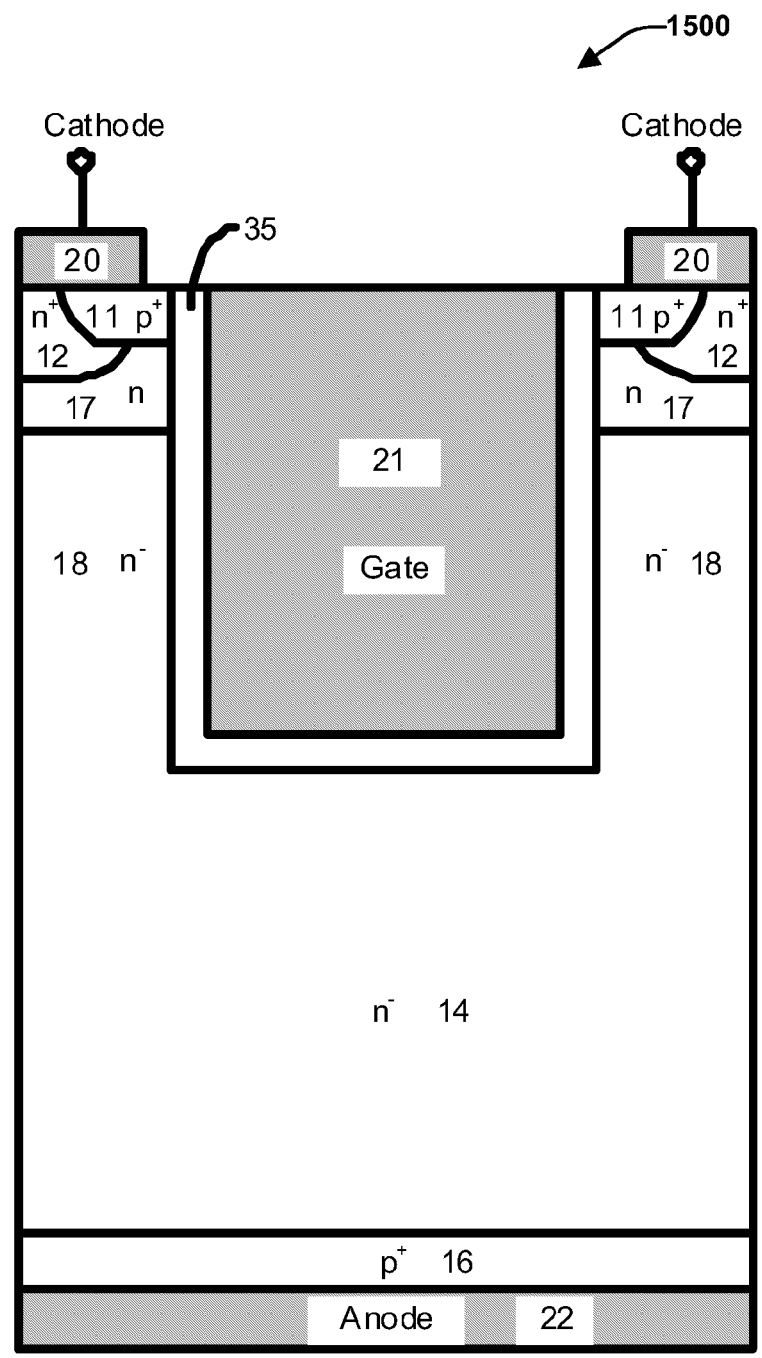
FIG. 15 presents a cross-sectional view of another example power semiconductor structure that forms a normally off gate controlled p-i-n switch with a charge trapping layer in the dielectric and a self depleted channel in accordance with aspects and embodiments described herein.

FIG. 15 presents a cross-section of power semiconductor device 1500 that forms a gate-controlled p-i-n switch having a charge trapping material in the gate dielectric and a self-depleted channel in accordance with an alternate embodiment. Device 1500 is analogous to device 300 aside from the removal of the n-buffer 15 region. In particular, device 1500 includes an NPT backside design. Device 1500 has a relatively thicker n⁻-drift region 14 compared to that of device 300 and does not include an n-buffer 15 region. Formation of device 1500 is analogous to the formation of device 1400 except the step of forming the n-buffer region is skipped.

The resultant power devices formed herein are useful in any electronic device. For example, the resultant power devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like. In an exemplary embodiment, the subject power semiconductor devices (e.g., device 300 and 1500) are particularly suitable for use as switches in various high voltage power (e.g., wherein the input and/or output voltage is greater than 200 V) electronic systems and devices such as motor drives and switch mode power supplies.

Figure 16:
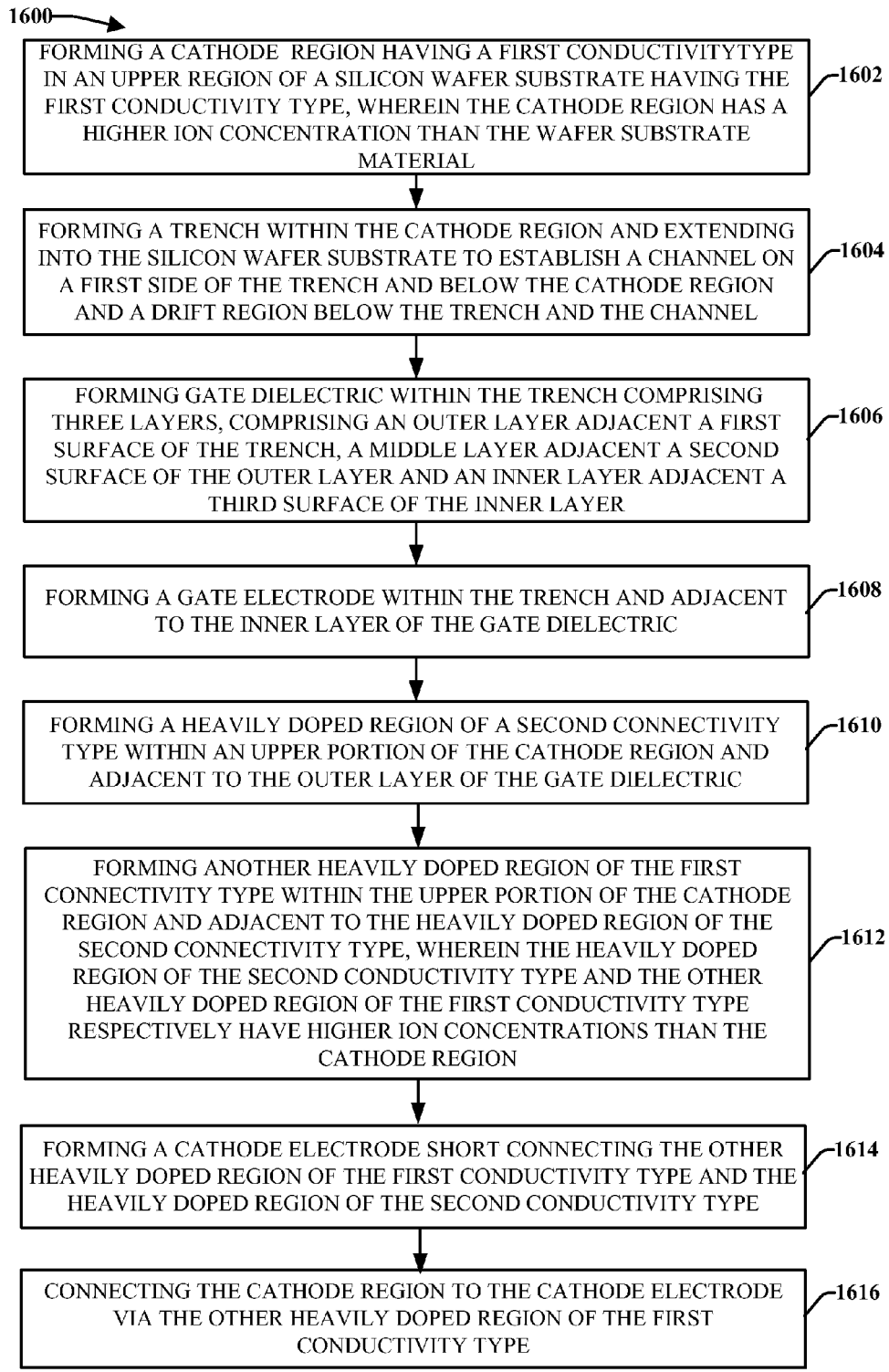
FIG. 16 provides a flow diagram of an example process for fabricating a power semiconductor structure that forms a normally off gate controlled p-i-n switch with a charge trapping layer in the dielectric and a self depleted channel in accordance with aspects and embodiments described herein.
Figure 17:
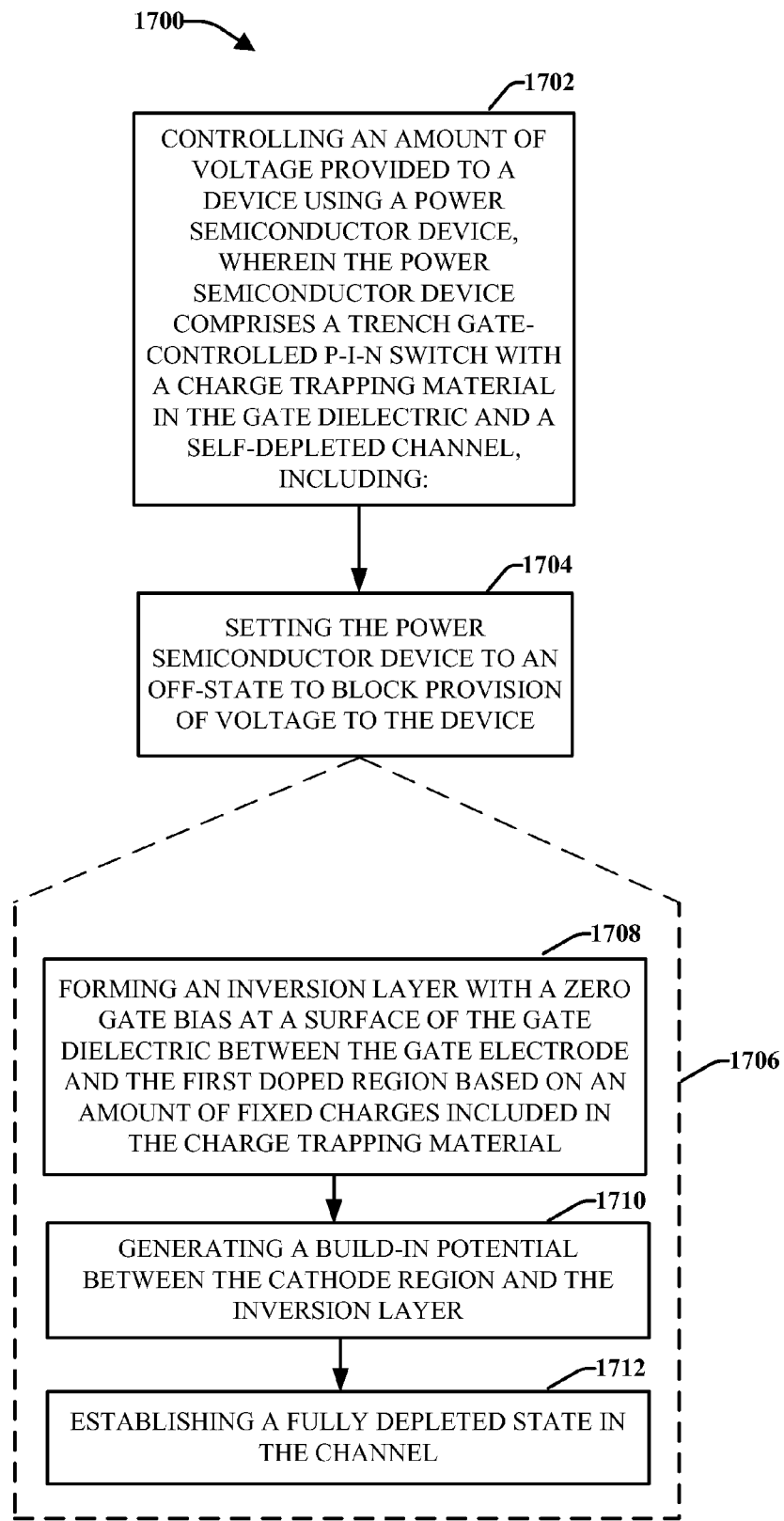
FIG. 17 provides a flow diagram of an example process for employing a power semiconductor with a charge trapping layer in the dielectric and a self depleted channel as normally off gate controlled p-i-n switch in accordance with aspects and embodiments described herein.
Figure 18:
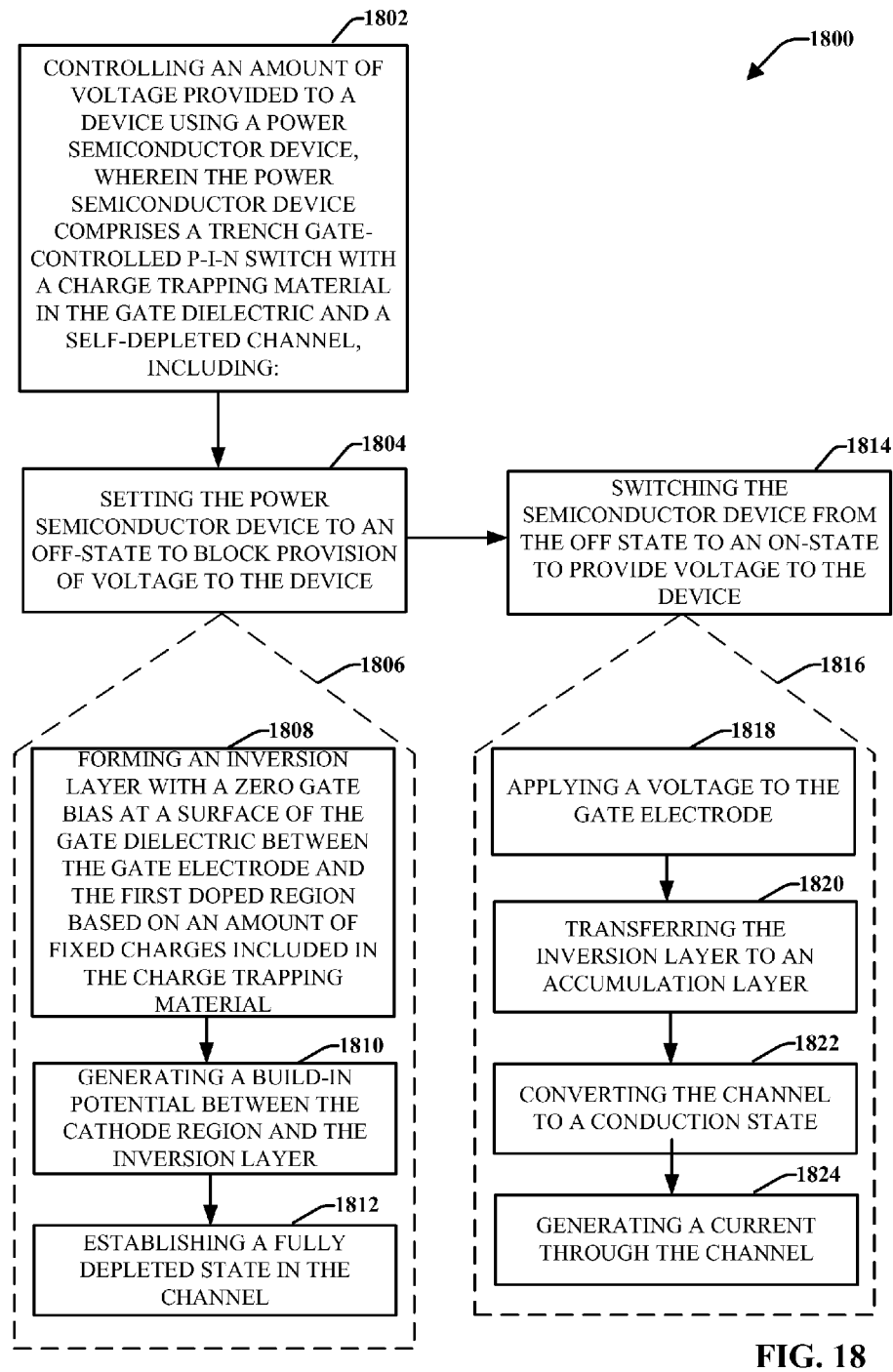
FIG. 18 provides a flow diagram of another example process for employing a power semiconductor with a charge trapping layer in the dielectric and a self depleted channel as normally off gate controlled p-i-n switch in accordance with aspects and embodiments described herein.

FIGS. 16-18 illustrate methods in accordance with certain aspects of this disclosure. While, for purposes of simplicity of explanation, the methods are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methods can alternatively be represented as a series of interrelated states or events, such as in a state diagram. Moreover, not all illustrated acts may be required to implement methods in accordance with certain aspects of this disclosure. Additionally, it is to be further appreciated that the method disclosed hereinafter and throughout this disclosure is capable of being stored on an article of manufacture to facilitate transporting and transferring such methods to computers.

Turning now to FIG. 16, presented is a high level flow diagram of a process 1600 for fabricating a power semiconductor device in accordance with various aspects and embodiments of the subject disclosure. At 1602, a cathode region (e.g., cathode region n-17) having a first conductivity type (e.g., an n-type or a p-type) is formed in an upper region of a silicon wafer substrate having the first conductivity type, wherein the cathode region has a higher ion concentration than the wafer substrate material. For example, when forming an n-channel power semiconductor device, the cathode region can be formed via implantation and annealing of n-type ions into an upper region of an n$^-$-silicon wafer at concentration between $1 \times 10^{16}$ cm$^{-3}$ and about $1 \times 10^{19}$ cm$^{-3}$. At 1604, a trench (e.g., trench 601) is formed within the cathode region and extending into the silicon wafer substrate to establish a channel (e.g., n$^-$-channel 18) on a first side of the trench and below the cathode region and a drift region (e.g., n$^-$-drift region 14) below the trench and the channel. For example, the trench can be formed via etching. At 1606, a gate dielectric is formed within the trench. The gate dielectric (e.g., gate dielectric 35) is composed of three layers, including an outer layer (e.g., layer 30) adjacent a first surface of the trench, a middle layer (e.g., layer 31) adjacent a second surface of the outer layer and an inner layer (e.g., layer 32) adjacent a third surface of the inner layer. In an aspect, the gate dielectric forms an ONO stack wherein the middle layer is a charge trapping layer. The amount of fixed charges included in the charge trapping layer can be selected/determined based on a predetermined threshold voltage desired for the finished power semiconductor device.

At 1608, a gate electrode (e.g., gate electrode 21) is formed within the trench and adjacent to the inner layer of the gate dielectric. At 1610, a heavily doped region (e.g., heavily doped p$^+$-region 11) of a second connectivity type is formed within an upper portion of the cathode region and adjacent to the outer layer of the gate dielectric. For example, a heavily doped p$^+$-region can be formed via implantation and annealing of p-ions at a concentration between about $1 \times 10^{18}$ cm$^{-3}$ and about $1 \times 10^{21}$ into the upper portion of the cathode region. At 1612, another heavily doped region of the first connectivity type (e.g., heavily doped n$^{+-}$-region 12) within the upper portion of the cathode region and adjacent to the heavily doped region of the second connectivity type. For example, a heavily doped n$^-$-region can be formed via implantation and annealing of n-ions at a concentration between about $1 \times 10^{18}$ cm$^{-3}$ and about $1 \times 10^{21}$ into the upper portion of the cathode region. The heavily doped region of the second conductivity type and the other heavily doped region of the first conductivity type respectively have higher ion concentrations than the cathode region, and the cathode region has a higher ion concentration than the channel. At 1614, a cathode electrode short connecting the other heavily doped region of the first conductivity type and the heavily doped region of the second conductivity type is formed and at 1616 the cathode region is connected to the cathode electrode via the other heavily doped region of the first conductivity type. The backside of the power semiconductor device is then formed as a with a punch through configuration or NPT configuration after formation of the front side of the power semiconductor.

FIG. 17 presents a high level flow diagram of an example process 1700 for controlling an amount of voltage provided to a device using a power semiconductor device as a switch in accordance with various aspects and embodiments of the subject disclosure. At 1702, an amount of voltage provided to a device is controlled using a power semiconductor device, wherein the power semiconductor device is a trench gate-controlled p-i-n switch with a charge trapping material in the gate dielectric and a self-depleted channel (e.g., device 300, 1400, 1500 and the like). In particular, the power semiconductor device is composed of a gate electrode formed within a trench and having a gate dielectric with a charge trapping material lining surfaces of the gate electrode within the trench. A channel of a first conductivity type and first doping concentration is located next to a first side of the trench and adjacent to the gate dielectric. A cathode region of the first connectivity type and a second doping concentration greater than the first doping concentration is located above and adjacent to the channel and adjacent to the gate dielectric. The cathode region includes a first doped region of a second connectivity type and a third doping concentration greater than the second doping concentration located in an upper area the cathode region and adjacent to the gate dielectric, and a second doped region of the first connectivity type and a fourth doping concentration greater than the second doping concentration located in an upper area of the cathode region and adjacent to the first doped region. In an aspect, the third doping concentration and the fourth doping concentration are the same or substantially similar (e.g., $1 \times 10^{18}$ cm$^{-3}$ and about $1 \times 10^{21}$). The power semiconductor further includes a cathode electrode short-connecting the first doped region and the second doped region, wherein the cathode region is connected to the cathode electrode through the second doped region.

At 1704, the method for controlling the amount of power provided to the device using the subject power semiconductor device includes setting the power semiconductor device to an off-state to block provision of voltage to the device. In particular, with the above configuration, the power semiconductor is a normally off device when low (e.g., below the threshold voltage) or no voltage (e.g., positive voltage) is applied to the gate electrode. Thus in an aspect, the power semiconductor can be switched from an on-state to an off-state by removing an amount of applied voltage to the gate electrode such that the amount of voltage applied to the gate electrode is below the threshold voltage required to turn the power semiconductor device on.

The process for setting the power semiconductor device to the off state is represented in call out box 1706. In particular, at 1708 an inversion layer (e.g., layer 402) with a zero gate bias is formed at a surface of the gate dielectric between the gate electrode and the first doped region based on an amount of fixed charges included in the charge trapping material. At 1710, a build-in potential is generated between the cathode region and the inversion layer and at 1712, a fully depleted state is established in the channel. Process 1700 can be employed to control the amount of voltage provided to any suitable device. In an exemplary embodiment, process 1700 is employed to control the amount of voltage provided to various high voltage power (e.g., wherein the input and/or output voltage is greater than 200 V) electronic systems and devices such as motor drives and switch mode power supplies.

FIG. 18 presents a high level flow diagram of another example process 1800 for controlling an amount of voltage provided to a device using a power semiconductor device as a switch in accordance with various aspects and embodiments of the subject disclosure. At 1802, an amount of voltage provided to a device (e.g., a motor drive or and switch mode power supply) is controlled using a power semiconductor device, wherein the power semiconductor device is a trench gate-controlled p-i-n switch with a charge trapping material in the gate dielectric and a self-depleted channel (e.g., device 300, 1400, 1500 and the like). At 1804, the method for controlling the amount of power provided to the device using the subject power semiconductor device includes setting the power semiconductor device to an off-state to block provision of voltage to the device. The process for setting the power semiconductor device to the off state is represented in call out box 1806. In particular, at 1808 an inversion layer (e.g., layer 402) with a zero gate bias is formed at a surface of the gate dielectric between the gate electrode and the first doped region based on an amount of fixed charges included in the charge trapping material. At 1810, a build-in potential is generated between the cathode region and the inversion layer and at 1812, a fully depleted state is established in the channel.

At 1814, the method for controlling the amount of power provided to the device using the subject power semiconductor device further includes switching the semiconductor device from the off state to an on-state to provide voltage to the device. The process for setting the power semiconductor device to the off state is represented in call out box 1816. At 1818, a voltage (e.g., a positive voltage greater than the threshold voltage) is applied to the gate electrode. At 1820, the inversion layer is transferred to an accumulation layer. At 1822, the channel is converted to a conduction state, and at 1824, a current is generated through the channel.

What has been described above includes examples of the subject invention. It is, of course, not possible to describe every conceivable combination of components or methods for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A power semiconductor structure, comprising:
   a trench lined with a gate dielectric comprising three layers, comprising an inner layer, an outer layer, and a middle layer formed between the inner layer and the outer layer;
   a gate electrode formed within the trench and adjacent to the inner layer;
   a lightly doped channel of a first conductivity type located next to a first side of the trench and adjacent to the outer layer, wherein the lightly doped channel is doped no more than a first defined doping level;
   a lightly doped drift region of the first conductivity type located below a second side of the trench, below the channel, and adjacent to the outer layer, wherein the lightly doped drift region is doped no more than a second defined doping level;
   a cathode region of the first connectivity type located above and adjacent to the channel, and adjacent to the outer layer;
   a heavily doped region of a second connectivity type located above and adjacent to the cathode region and adjacent to the outer layer, wherein the heavily doped region is doped no less than a third defined doping level;
   another heavily doped region of the first connectivity type located above and adjacent to the cathode region and adjacent to the heavily doped region of the second connectivity type, wherein the other heavily doped region is doped no less than a fourth defined doping level; and
   a cathode electrode short connecting the other heavily doped region of the first conductivity type and the heavily doped region of the second conductivity type, wherein the cathode region is connected to the cathode electrode via the other heavily doped region of the first conductivity type.

2. The power semiconductor structure of claim 1, wherein the middle layer of the gate dielectric comprises a charge trapping material.

3. The power semiconductor structure of claim 2, wherein the charge trapping material comprises at least one of silicon nitride or silicon nanocrystal, and wherein negative fixed charges are created in the charge trapping material.

4. The power semiconductor structure of claim 1, wherein an inversion layer with a zero gate bias is formed between the heavily doped region of the second connectivity type and the outer layer when the power semiconductor structure is in an off-state.

5. The power semiconductor structure of claim 4, wherein the channel has a self-depleted state when the semiconductor structure is in the off-state based on a build-in potential generated between the cathode region and the inversion layer.

6. The power semiconductor structure of claim 5, wherein the inversion layer is transferred to an accumulation layer and the channel charge state becomes neutral when the power semiconductor structure is in an on-state based on application of a positive voltage to the gate electrode.

7. The power semiconductor structure of claim 1, wherein the cathode region has a higher doping concentration than the channel.

8. The power semiconductor structure of claim 7, wherein the cathode region has a doping concentration between about $1\times10^{16}$ cm$^{-3}$ and about $1\times10^{19}$ cm$^{-3}$.

9. The power semiconductor structure of claim 1, wherein the first and the second defined doping levels are respective upper ends of a doping concentration range between about $1\times10^{13}$ cm$^{-3}$ and about $1\times10^{15}$ cm$^{-3}$ and the third and the fourth defined doping levels are respective lower ends of another doping concentration range between about $1\times10^{18}$ cm$^{-3}$ and about $1\times10^{21}$ cm$^{-3}$.

10. The power semiconductor structure of claim 1, wherein the outer layer of the gate dielectric comprises native silicon oxide.

11. The power semiconductor structure of claim 1, wherein the inner layer of the gate dielectric comprises at least one of silicon oxide or aluminum oxide.

12. The power semiconductor structure of claim 1, further comprising:
  a buffer region of the first conductivity type located adjacent to and below the lightly doped drift region;
  a heavily doped anode region of the second conductivity type located adjacent to and below the buffer region, wherein the heavily doped anode region is doped no less than a fifth defined doping level; and
  an anode electrode located adjacent to and below the anode region.

13. The power semiconductor structure of claim 1, further comprising:
  a heavily doped anode region of the second conductivity type located adjacent to and below the drift region, wherein the heavily doped anode region is doped no less than a fifth defined doping level; and
  an anode electrode adjacent to and below the anode region.

14. The power semiconductor structure of claim 1, further comprising:
  a buffer region of the first conductivity type located adjacent to and below the lightly doped drift region;
  a heavily doped anode region of the second conductivity type located adjacent to and below the buffer region, wherein the heavily doped anode region comprises ion implantation at an activated dose between about $1\times10^{12}$ cm$^{-2}$ and $1\times10^{14}$ cm$^{-2}$; and
  an anode electrode located adjacent to and below the anode region.

15. The power semiconductor structure of claim 1, further comprising:
  a heavily doped anode region of the second conductivity type located adjacent to and below the drift region, wherein the heavily doped anode region comprises ion implantation at an activated dose between about $1\times10^{12}$ cm$^{-2}$ and $1\times10^{14}$ cm$^{-2}$; and
  an anode electrode adjacent to and below the anode region.

\* \* \* \* \*